United States Patent [19]

Baer

[11] Patent Number: 4,554,518

[45] Date of Patent: Nov. 19, 1985

[54] WIDE BAND IMPEDANCE TRANSFORMER WITH TRANSFORMATION RATIO CLOSE TO THREE FOR RADIO FREQUENCIES

[75] Inventor: Jean-Michel Baer, Franconville, France

[73] Assignee: Thomson CSF, Paris, France

[21] Appl. No.: 620,259

[22] Filed: Jun. 13, 1984

[30] Foreign Application Priority Data

Jun. 17, 1983 [FR] France ............................. 83 10064

[51] Int. Cl.[4] ............................................. H01P 5/02
[52] U.S. Cl. ..................................... 333/33; 336/180; 336/195
[58] Field of Search .................... 333/24 R, 33, 245; 336/180, 195

[56] References Cited

U.S. PATENT DOCUMENTS 3,370,257 2/1968 Spierling ................................ 333/33
4,222,016 9/1980 Stock et al. ...................... 333/33 X

FOREIGN PATENT DOCUMENTS 867044 5/1961 United Kingdom ............... 336/195
560263 6/1977 U.S.S.R. ............................. 336/195

*Primary Examiner*—Paul Gensler

*Attorney, Agent, or Firm*—Cushman, Darby & Cushman

[57] ABSTRACT

A wide band impedance transformer for operating at radio frequencies whose impedance transformation ratio is equal to three within ten percent, comprising coaxial cables connected together so as to determine a transformation ratio equal to $(5/3)^2 = 2.78$. For that, a first coaxial cable has the first and the second ends of its inner conductor coupled respectively to the input terminal and to the output terminal of the transformer and the first end of its outer conductor connected to ground, a second coaxial cable has the first and the second ends of its inner conductor connected respectively to the first end of the inner conductor of the first cable and to the second end of the outer conductor of the first cable and the second end of its outer conductor connected to ground, a third coaxial cable has the first and the second ends of its inner conductor connected respectively to the first end of the outer conductor of the second cable and to the second end of the inner conductor of the second cable and the first end of its outer conductor connected to ground, and a conducting connector connects together the first end of the inner conductor of the third cable and the second end of the outer conductor of this third cable.

5 Claims, 7 Drawing Figures

WIDE BAND IMPEDANCE TRANSFORMER WITH TRANSFORMATION RATIO CLOSE TO THREE FOR RADIO FREQUENCIES

BACKGROUND OF THE INVENTION

The present invention relates to wide band impedance transformers with an impedance transformation ratio close to three operating at radio frequencies.

Such transformers are in particular required when three synchronized transmitters, with an output impedance Ro, are to be coupled to the same antenna with impedance Ro. In fact, a coupler is then used which comprises three inputs to which the three transmitters are connected, and an output; but since this output has an impedance Ro/3 it is necessary to insert an impedance transformer having an impedance transformation ratio as close as possible to three between the output of the coupler and the antenna. It is known to use, as impedance transformer with a transformation ratio close to three, a self transformer having an impedance transformation ratio equal to four formed from four coaxial cable sections connected as will be shown in FIG. 1 hereafter. These known impedance transformers, having a transformation ratio fairly different from three, do not then provide good matching. To avoid this when for example, a group of three transmitters would be sufficient, it is known to use four transmitters; thus the transformer with a ratio 4 provides very good matching between the output of impedance Ro/4 of the coupler of the four transmitters and the antenna of impedance Ro. But this is an expensive solution since it leads to using an extra transmitter.

BRIEF SUMMARY OF THE INVENTION

The aim of the present invention is to avoid the drawbacks of the prior art by providing an impedance transformer having a transformation ratio equal to 3 within at least ten percent.

This is obtained, in accordance with the invention, by using an impedance transformer having the ratio of $(5/3)^2$, that is to say about 2.78.

According to the present invention, there is provided a wide band impedance transformer for radio frequencies of the coaxial cable type, having a transformation ratio close to three, which comprises an input terminal, an output terminal, a conducting connection and a first, a second and a third coaxial cable, each having an inner conductor with a first and a second end and an outer conductor with a first and a second end and wherein the first cable has the first and second ends of its inner conductor coupled respectively to the input terminal and to the output terminal and the first end of its outer conductor connected to ground, the second cable has the first and the second ends of its inner conductor connected respectively to the first end of the inner conductor of the first cable and the second end of the outer conductor of the first cable and the second end of its outer conductor connected to ground, the third cable has the first and the second ends of its inner conductor connected respectively to the first end of the outer conductor of the second cable and to the second end of the inner conductor of the second cable and the first end of its outer conductor connected to ground, and the connection connects together the first end of the inner conductor of the third cable and the second end of the outer conductor of this third cable.

BRIEF DESCRIPTION OF THE DRAWINGS

The present invention will be better understood and other features will appear from the following description and the accompanying Figures which show.

In the different figures, the corresponding parts are designated by the same symbols.

MORE DETAILED DESCRIPTION

Figure 1:
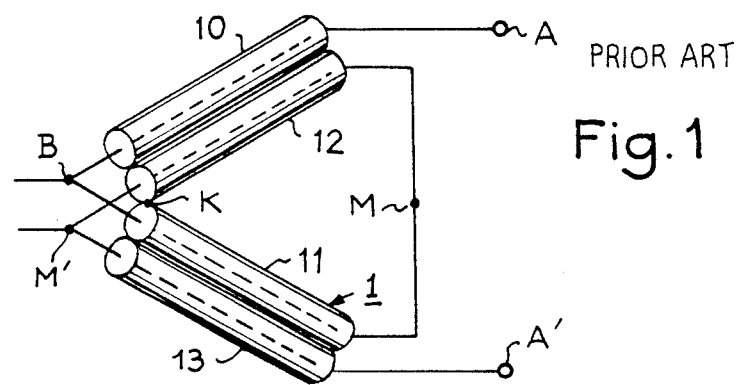
FIG. 1, an impedance transformer of the prior art.

FIG. 1 is a general diagram of an impedance transformer having a transformation ratio equal to four, which was discussed earlier. This transformer may be defined as being a conductor which forms two turns whose ends A and A' form the terminals of the secondary circuit, for connection of an impedance Ro and whose middle point is designated by the letter M. Two terminals, B and M', connected respectively to the middle of the two turns form the terminals of the primary circuit, for connection of an impedance of value Ro/4. As FIG. 1 shows, the transformer is formed from four coaxial cables 10–13 connected as follows: the inner conductors of cables 10 to 13 are connected respectively between terminals A and B, B and M, M' and M, M' and A' and the outer conductors of cables 10 and 12 on the one hand and 11 and 13 on the other are joined side by side and are connected all four together, at one of their ends, by an electrical connection K. The drawbacks of such a transformer, in some circuits where it has been used up to present, have been mentioned earlier.

To avoid these drawbacks by providing an impedance transformer having a transformation ratio much closer to three than four, it should be noted that three is very close to $(5/3)^2$, that is to said about 2.78. By proceeding by successive steps and by arguing from voltages instead of from impedances, such a transformer may be determined as shown in FIGS. 2 to 6.

In FIGS. 2 to 5, the whole and fractional numbers 1, 5/3, $\frac{2}{3}$, $\frac{1}{3}$ correspond, for a voltage applied to the input E of the coupler, to the multiplicative coefficients of this voltage at different points of the transformer. Thus the voltage U applied to input E is represented by the number 1, whereas the voltage $(5/3)U$ to be obtained at the output S of the transformer, so as to have the impedance transformation ratio equal to $(5/3)^2$, is represented by the number 5/3.

Figure 2:
FIGS. 2 to 6, diagrams showing the successive steps of the reasoning which led to the invention.
Figure 3:
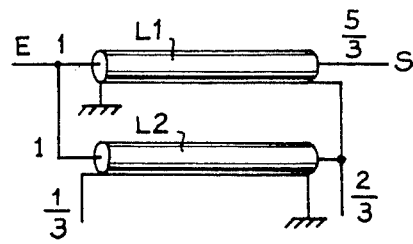
Figure 4:
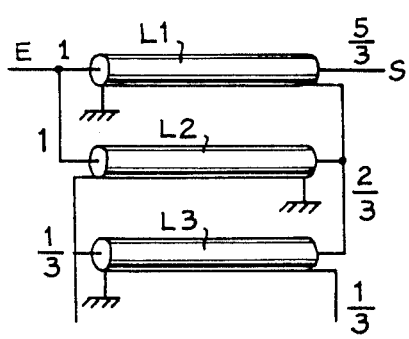

FIG. 2 represents a coaxial cable L1 in which the first end of the inner conductor is connected to the input E of the transformer and receives the voltage U; the first end of the outer conductor of this cable is grounded: zero voltage. So that the output S of the transformer, formed by the second end of the inner conductor of cable L1, is at a voltage $5/3\ U$, the second end of the outer conductor of cable L1 must be at a voltage of $\frac{2}{3} U$, which in fact gives at the ends of cable L1

$$U - 0 = (5/3)U - \tfrac{2}{3}U$$

This voltage of $\frac{2}{3} U$ may be obtained (FIG. 3) by means of a coaxial cable L2 which receives the voltage U at the first end of its inner conductor, the voltage U/3 at the first end of its outer conductor and in which the second end of the outer conductor is grounded; in fact in this case we have $$U - U/3 = \tfrac{2}{3}U - 0$$

The problem is now to obtain the voltage U/3 to be applied to the first end of the outer conductor of the coaxial cable L2. For that (see FIG. 4) it is possible to use a third coaxial cable L3 in which the first end of the inner conductor is connected to the first end of the outer conductor (voltage U/3) of cable L2, in which the first end of the outer conductor is grounded (zero voltage), in which the second end of the inner conductor is connected to the second end of the inner conductor of cable L2 (voltage $\tfrac{2}{3}$) and in which the second end of the outer conductor is at voltage U/3, so as to have the equality $$U/3 - 0 = \tfrac{2}{3}U - U/3$$

Figure 5:
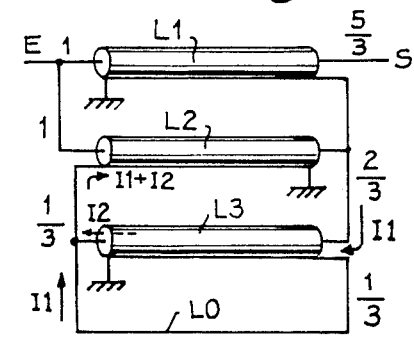

Now, so as to have U/3 at the first end of the inner conductor of cable L3 and at the second end of its outer conductor, it is sufficient to have a conducting connection forming a short circuit between these two ends. Thus an impedance transformer is obtained having a ratio $(5/3)^2$; FIG. 5 is a diagram of such a transformer with its short circuit L0 between the first end of the inner conductor of cable L3 and the second end of the outer conductor of this same cable.

Figure 6:
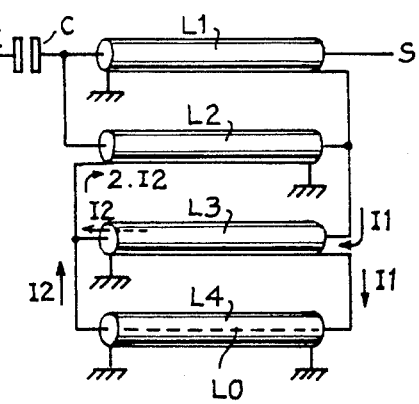

It should be noted, in the diagram of FIG. 5, that the current I1+I2 which arrives at the first end of the outer conductor of cable L2 is the sum of two currents which are not in phase: a current I1 which passes through the short circuit L0 and which is equal to the current which arrives at the second end of the inner conductor of cable L3 and a current I2 which comes from the first end of the inner conductor of cable L3. So as to put these two currents into phase and thus improve the operation of the transformer, it is possible, as shown in FIG. 6, to replace the short circuit L0 by the inner conductor L0 of a coaxial cable L4 identical to cable L3 and in which the ends of the outer conductor are grounded; with the transformer shown in FIG. 6, the current which arrives at the first end of the outer conductor of cable L2 is the sum of two identical currents: I2+I2.

FIG. 6 also shows a capacitor C, connected to the input of the transformer; this capacitor forms, with the distributed inductance of the coaxial cables, a high-pass filter which improves the passband of the transformer.

Figure 7:
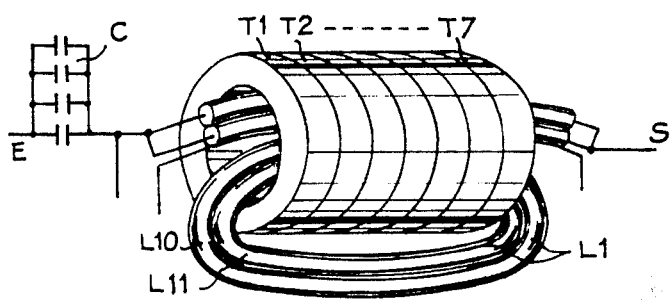
FIG. 7, the detailed representation of one of the elements of FIGS. 5 or 6.

FIG. 7 shows one embodiment of the coaxial cables L1, L2, L3 of FIGS. 5 and 6. Since cables L2 and L3 are identical to cable 1, only this latter cable is shown. The example described corresponds to a transformer to one axis of which is to be connected a transmitting device having an output impedance of 16.7 ohms, a working frequency band which goes from 20 to 120 MHz and an output power of 1000 watts; to the other access of this transformer is to be connected an antenna with an input impedance equal to 50 ohms.

FIG. 7 shows that the coaxial cable L1 is in fact formed from two parallel connected cables L10, L11. The two cables L10, L11 pass through and surround seven successive rings joined side by side T1 to T7. These rings are ferrite rings of FN 23-1105 type commercialized by the firm LTT; they serve for increasing the shock coil effect produced by the distributed inductance of the coaxial cables and thus for widening the passband of the transformer. It should be noted that cable L4 of FIG. 6 is not surrounded by ferrite rings, in fact, since both ends of its outer conductor are grounded, there are no parasite currents in this conductor and so there is no need to create a shock coil by increasing the distributed inductance of cable L4 by means of ferrites.

In so far as the characteristic impedance Zc of coaxial cables L1, L2, L3, L4 of FIG. 6 is concerned, it is conventionally determined by connecting an impedance of 16.7 ohms to the input E and calculating the impedance Zs seen at the output S; the result is in the form $$Zs = 50 \text{ ohms} + F \cdot f(Zc) + F^2 \cdot g(Zc) + F^3 \cdot h(Zc) + \ldots$$

where F is the working frequency considered and f(Zc), g(Zc), h(Zc) are the functions of Zc.

Zc is then chosen so as to cancel out the term f(Zc). In the case of the example described that leads to Zc=30 ohms but, for the sake of convenience, Zc has been taken equal to 25 ohms and formed by means of two paralleled coaxial cables having a characteristic impedance equal to 50 ohms.

It should be further noted that, in the embodiments of the circuit shown in FIG. 6, the coaxial cables L1, L2, L3, L4 all have a length of 20 cm but that this length is not critical for the correct operation of the impedance transformer.

As for capacitor C of FIG. 6, FIG. 7 shows that it is formed from four capacitors in parallel; these capacitors are ceramic capacitors of the chip type of a 100 pF each one.

The present invention is not limited to the example described and in particular the choice of the impedance values for other constructions, will be made depending on the input and output characteristics of the transformer to be constructed.

What is claimed is:

1. A wide band impedance transformer for radio frequencies of the coaxial type, having a transformation ratio close to 3, which comprises an input terminal, an output terminal, a conducting connection and a first, a second and a third coaxial cable, each having an inner conductor with a first and a second end and an outer conductor with a first and a second end and wherein the first cable has the first and the second ends of its inner conductor coupled respectively to the input terminal and to the output terminal and the first end of its outer conductor connected to ground, the second cable has the first and second ends of its inner conductor connected respectively to the first end of the inner conductor of the first cable and to the second end of the outer conductor of the first cable and the second end of its outer conductor connected to ground, the third cable has the first and the second ends of its inner conductor connected respectively to the first end of the outer conductor of the second cable and to the second end of the inner conductor of the second cable and the first end of its outer conductor connected to ground, and the connection connects together the first end of the inner conductor of the third cable and the second end of the outer conductor of the third cable.

2. The transformer as claimed in claim 1, wherein said connection is a short circuit.

3. The transformer as claimed in claim 1, further comprising a fourth coaxial cable having an inner conductor which forms the connection and an outer conductor with a first and second end connected to ground.

4. The transformer as claimed in claim 1, comprising a capacitor and wherein the first end of the inner conductor of said first cable is coupled to the input terminal by the capacitor.

5. The transformer as claimed in claim 1, comprising magnetic circuits and wherein the first, second and third coaxial cables are surrounded by the magnetic circuits for increasing the value of their apparent inductance.

* * * * *